United States Patent [19]
Lee

[11] Patent Number: 5,844,854
[45] Date of Patent: Dec. 1, 1998

[54] PROGRAMMABLE LOGIC DEVICE WITH TWO DIMENSIONAL MEMORY ADDRESSING

[75] Inventor: Fung Fung Lee, Milpitas, Calif.

[73] Assignee: Altera Corporation, San Jose, Calif.

[21] Appl. No.: 759,304

[22] Filed: Dec. 2, 1996

Related U.S. Application Data

[60] Provisional application No. 60/026,288 Sep. 18, 1996.

[51] Int. Cl.[6] .................................................. G11C 13/00
[52] U.S. Cl. ............................... 361/230.01; 365/230.03
[58] Field of Search .................... 365/230.01, 230.03, 365/189.01

[56] References Cited

U.S. PATENT DOCUMENTS

| | | | |
|---|---|---|---|
| Re. 34,363 | 8/1993 | Freeman | 307/465 |
| 3,473,160 | 10/1969 | Wahlstrom | 172/5 |
| 4,593,373 | 6/1986 | Kiuchi | 364/736 |
| 4,609,986 | 9/1986 | Hartmann et al. | 364/20 C |
| 4,617,479 | 10/1986 | Hartmann et al. | 307/465 |
| 4,642,487 | 2/1987 | Carter | 307/465 |
| 4,677,318 | 6/1987 | Veenstra | 307/465 |
| 4,713,792 | 12/1987 | Hartmann et al. | 364/900 |
| 4,751,671 | 6/1988 | Babetski et al. | 364/900 |
| 4,758,745 | 7/1988 | Elgamal et al. | 307/465 |
| 4,774,421 | 9/1988 | Hartmann | 307/465 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 4,942,541 | 7/1990 | Hoel et al. | 364/519 |
| 5,027,326 | 6/1991 | Jones | 365/221 |
| 5,121,006 | 6/1992 | Pedersen | 307/465 |
| 5,128,559 | 7/1992 | Steel | 307/465 |
| 5,146,428 | 9/1992 | Tanimura | 365/189 |
| 5,220,214 | 6/1993 | Pedersen | 307/465 |
| 5,258,668 | 11/1993 | Cliff et al. | 307/465 |
| 5,260,610 | 11/1993 | Pedersen et al. | 307/465 |
| 5,274,581 | 12/1993 | Cliff et al. | 364/784 |
| 5,274,596 | 12/1993 | Watanabe | 365/230.03 |
| 5,350,954 | 9/1994 | Patel | 307/465 |
| 5,371,422 | 12/1994 | Patel et al. | 326/41 |
| 5,396,608 | 3/1995 | Garde | 395/400 |
| 5,506,850 | 4/1996 | Osann, Jr. | 371/22.1 |
| 5,541,530 | 7/1996 | Cliff et al. | 326/41 |
| 5,543,732 | 8/1996 | McClintock et al. | 326/41 |
| 5,592,106 | 1/1997 | Leong et al. | 326/41 |
| 5,614,840 | 3/1997 | McClintock et al. | 326/41 |

OTHER PUBLICATIONS

John L. Nichols, "A Logical Next Step for Read–Only Memories", Electronics, Jun. 12, 1967, pp. 111–113.

Floyd Kvamme, "Standard Read–Only Memories Simplify Complex Logic Design", Electronics, Jan. 5, 1970, pp. 88–95.

Albert Hemel, "Making Small ROM's [sic] Do Math Quickly, Cheaply and Easily", Electronics, May 11, 1970, pp. 104–11.

William I. Fletcher et al., "Simplify Sequential Circuit Designs", Electronic Design, Jul. 8, 1971, pp. 70–72.

Howard A. Scholl et al., "Design of Asynchronous Sequential Networks Using Read–Only Memories", IEEE Transactions on Computers, vol. C–24, No. 2, Feb. 1975, pp. 195–206.

(List continued on next page.)

*Primary Examiner*—Terrell W. Fears
*Attorney, Agent, or Firm*—Fish & Neave; Robert R. Jackson; G. Victor Treyz

[57] ABSTRACT

A programmable logic array integrated circuit device having a memory array in which data can be accessed in either a transposed or nontransposed mode. The memory array has multiple rows and columns of memory cells. Each row of cells can be viewed as a matrix made up of virtual rows and virtual columns. Data in a given row of the memory array can be accessed using nontransposed data words that contain data bits corresponding to cells in the virtual rows. Data in the given row can also be accessed using transposed data words that contain data bits corresponding to cells in the virtual columns.

22 Claims, 11 Drawing Sheets

OTHER PUBLICATIONS

Arnold Weinberger, "High–Speed Programmable Logic Array Adders", IBM J. Res. Develop., vol. 23, No. 2, Mar. 1979, pp. 163–178.

Yahiko Kambayashi, "Logic Design of Programmable Logic Arrays", IEEE Transactions on Computers, vol. C–28, No. 9, Sep. 1979, pp. 609–617.

R.C. Minnick, "A Survey of Microcellular Research," Journal of the Association for Computing Machinery, vol. 14, No. 2, pp. 203–241, Apr. 1967.

S.E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, Chapters VI and IX, pp. 229–254 and 369–422.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

"XC5000 Logic Cell Array Family, Technical Data, Advance Information," Xilinx, Inc., Feb. 1995.

|  | Virtual Column 0 | Virtual Column 1 | Virtual Column 2 | Virtual Column 3 | Virtual Column 4 | Virtual Column 5 | Virtual Column 6 | Virtual Column 7 |
|---|---|---|---|---|---|---|---|---|
| VIRTUAL ROW 0 | 0 | 1 | 2 | 3 | 4 | 5 | 6 | 7 |
| VIRTUAL ROW 1 | 8 | 9 | 10 | 11 | 12 | 13 | 14 | 15 |
| VIRTUAL ROW 2 | 16 | 17 | 18 | 19 | 20 | 21 | 22 | 23 |
| VIRTUAL ROW 3 | 24 | 25 | 26 | 27 | 28 | 29 | 30 | 31 |
| VIRTUAL ROW 4 | 32 | 33 | 34 | 35 | 36 | 37 | 38 | 39 |
| VIRTUAL ROW 5 | 40 | 41 | 42 | 43 | 44 | 45 | 46 | 47 |
| VIRTUAL ROW 6 | 48 | 49 | 50 | 51 | 52 | 53 | 54 | 55 |
| VIRTUAL ROW 7 | 56 | 57 | 58 | 59 | 60 | 61 | 62 | 63 |

PROGRAMMABLE LOGIC DEVICE WITH TWO DIMENSIONAL MEMORY ADDRESSING

This application claims the benefit of U.S. provisional application Ser. No. 60/026,288, filed Sep. 18, 1996.

BACKGROUND OF THE INVENTION

This invention relates to programmable logic devices. More particularly, this invention relates to techniques for accessing data in memory arrays on programmable logic devices.

Programmable logic array integrated circuits are devices that are programmable by a user to perform various logic functions. At their most basic level, programmable logic devices contain programmable components, such as erasable programmable read-only (EPROM) transistors, electrically erasable programmable read-only (EEPROM) transistors, random access memory (RAM) transistors or cells, fuses, and antifuses. Higher level functions are provided by organizing the programmable components into groups of components. The groups of components are electrically connected to one another by programmable interconnections. An illustrative programmable logic device is described in commonly-assigned copending U.S. patent application Ser. No. 08/442,795, filed May 17, 1995.

Programmable logic devices, such as those described in patent application Ser. No. 08/442,795, generally have arrays of random-access memory (RAM) for storing data during device operation. The memory arrays are made up of rows and columns of memory cells. Typically, the word size used to access data in the memory arrays is smaller than the physical dimensions of the memory arrays. For example, a two kilobit (2K) memory array might have 32 rows and 64 columns of memory cells for storing data, whereas the device might use eight bit data words. When it is desired to read or write a data word, the eight data bits are either retrieved from or written to the memory array.

Commonly-assigned copending U.S. patent application Ser. No. 08/555,109, filed Nov. 8, 1995, describes how the size of the data word that is used to access the memory array (its "width") and the resulting capacity of the array for data storage (its "depth") can be selectively programmed by the user in certain memory arrays. For example, a 2 kilobit (2K) variable depth and width memory array can be configured to a depth of 1K and a width of two bits or a depth of 2K and a width of one bit.

With a typical addressing arrangement, the memory cells in the array that are accessed during a read or write operation are located in adjacent memory cells in a row. For example, in a 32×64 RAM array, a typical eight bit word might be made up of the first eight bits in the second row. Accessing this word would involve addressing memory cells 0, 1, . . . , 7 in row 2.

Although this approach for addressing data in the memory array may be satisfactory for many applications, certain operations are difficult to implement efficiently. Many data format conversion, matrix transposition, and computer graphics operations (e.g., right-angle rotations) could benefit from the ability to address data in a different manner. For example, in some operations it may be desirable to store or retrieve the data for every eighth memory cell in a row, rather than for eight adjacent cells. Eight separate write or read operations must be performed to access the data in such nonadjacent cells. If it were possible to write or read data for every eighth cell in a single eight bit word, only one write or read operation would be required.

It is therefore an object of the present invention to provide an improved arrangement for accessing data in programmable logic device memory arrays.

SUMMARY OF THE INVENTION

This and other objects of the invention are accomplished in accordance with the principles of the present invention by providing a programmable logic device memory array arrangement in which data in the memory array can be accessed in either a transposed or nontransposed format. The memory array has multiple rows and column of memory cells (e.g., 32 rows and 64 columns of such cells). The memory cells of a given row of the memory array can be viewed as being organized in the form of a matrix that is made up of virtual rows and virtual columns of cells. Data in the given row can be accessed using nontransposed data words that contain data bits corresponding to cells in the virtual rows. Data in the given row can also be accessed using transposed data words that contain data bits corresponding to cells in the virtual columns.

The mode in which data in the memory array is accessed (transposed or nontransposed) is controlled through the application of a transpose enable (TE) signal. When the transpose enable signal is high, data is accessed in the transposed format. When the transpose enable signal is low, data is accessed in the nontransposed format.

The memory array has a width and a depth. The width of the memory array corresponds to the size of the data words used to access data in the memory array (e.g., one bit, two bits, four bits, or eight bits). The depth of the memory array corresponds to the number of such data words in the array (e.g., 1K, 2K, etc.). The memory array may have a fixed depth and width configuration or may have a variable depth and width configuration.

In the fixed depth and width configuration, the data words used to access the memory array have a fixed size (e.g., eight bits). Changing the transpose enable bit in the fixed depth and width configuration switches the memory array between the transposed format and the nontransposed format.

In the variable depth and width configuration, the depth and width of the memory array can be changed. For example, the memory array can be placed in a ×1 mode (one-bit words), a ×2 mode (two-bit words), a ×4 mode (four-bit words), or a ×8 mode (eight-bit words). The depth of the memory array is automatically adjusted based on the selected width. A variable depth and width memory array may be switched between the transposed and nontransposed formats (e.g., when the array is in the ×8 mode). If desired, circuitry may be provided to allow the memory array to be switched between the transposed and nontransposed formats in other width configurations (e.g., in the ×1, ×2, and ×4 modes).

Further features of the invention, its nature and various advantages will be more apparent from the accompanying drawings and the following detailed description of the preferred embodiments.

BRIEF DESCRIPTION OF THE DRAWINGS

FIG. 5 is a diagram of a 2×2 matrix having virtual rows and virtual columns and having elements that correspond to data bits in a given row of a memory array.

DETAILED DESCRIPTION OF THE PREFERRED EMBODIMENTS

Figure 1:
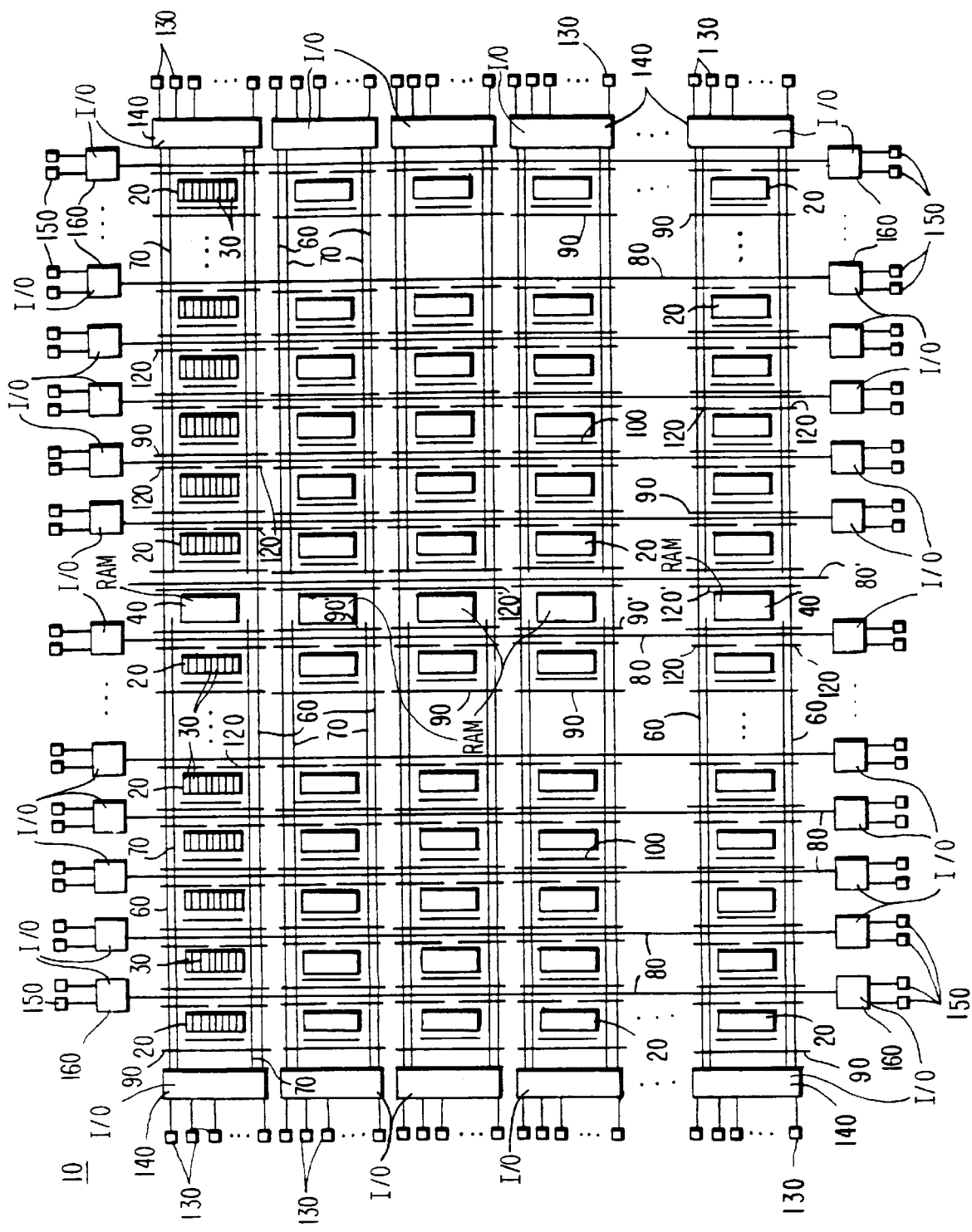
FIG. 1 is a diagram of an illustrative programmable logic device having regions of random access memory (RAM).

Programmable logic array integrated circuit devices are described in commonly assigned copending U.S. patent application Ser. No. 08/442,795, filed May 17, 1995, which is hereby incorporated by reference herein. As shown in FIG. 1 (which is based on FIG. 1 of the '795 application), an illustrative programmable logic integrated circuit device 10 has a plurality of regions 20 of programmable logic disposed on the device in a two dimensional array of intersecting rows and columns. A typical programmable logic device 10 has ten rows and 36 columns of regular regions 20 and additional spare regions 20 (not shown). These columns are divided into two groups: 18 regular columns to the left of a central column of random access memory ("RAM") regions 40 and 18 regular columns to the right of the central column of RAM regions 40.

Each region 20 includes a plurality of subregions or logic modules 30 of programmable logic. For example, there may be eight logic modules 30 in each region 20. Logic modules 30 may be constructed in various ways, such as product-term-based macrocells or as look-up tables. Each logic module 30 can be independently programmed to provide as an output signal any logical combination of its inputs.

Each row has two groups of horizontal interconnection conductors 60 that extend the entire length of the row. Each row also has four groups of horizontal interconnection conductors 70 that extend along half the length of the row. Each column of regular logic regions 20 has a group of vertical interconnection conductors 80 that extend along the length of the column.

In order to feed logic signals to each region 20, each regular logic region has associated region feeding conductors 90 that can bring signals to the logic region from the horizontal conductors 60 and 70 associated with that region. Programmable connections can be formed so that conductors 90 interconnect conductors 60 and 70 with logic regions 20. Each region 20 also has associated local feedback conductors 100 for making the outputs of logic modules 30 available as inputs to other logic modules in the same logic region 20.

Output conductors 120 are associated with each region 20 for conveying the output logic signals of the logic modules 30 in that region to the associated conductors 60 and 70. Programmable connections can be formed so that conductors 120 interconnect conductors 60 and 70 with logic region 20. The output signals of logic regions 20 are also programmably connectable to the vertical conductors 80 associated with each region.

Programmable logic connectors ("PLCs") are associated with each regular logic region 20 for making connections from the vertical (80) to the horizontal (60 and 70) conductors associated with the region. Other PLCs are associated with each regular logic region 20 for making connections from the horizontal (60) to the vertical (80) conductors associated with the region.

At the ends of each row there are eight "horizontal" input/output pins 130, which are programmably connectable to the adjacent conductors 60 and 70 associated with that row via PLC input/output (I/O) networks 140. At the top and bottom of each column of regular logic regions 20 there are two "vertical" input/output pins 150, which are programmably connectable to the conductors 80 associated with that column via PLC I/O networks 160.

At the center of each row, there is a region of RAM 40 that can be used to store data. Each RAM region 40 can receive data via a plurality of RAM feeding conductors 90'. Conductors 90' can receive signals from the conductors 60 and from the left half of the conductors 70 associated with the row that includes the RAM region served by those conductors 90'. Conductors 90' are programmably connectable to conductors 60 and 70.

Each RAM region 40 can output its data to an associated plurality of RAM output conductors 120' and to a plurality of vertical interconnection conductors 80' that extend along the length of the column of RAM regions 40. Conductors 120' can be used to apply the associated RAM output signals to the conductors 60 associated with the row that includes the RAM region 40 producing those output signals. Conductors 80' can be used to convey the RAM output signals to other rows of the device. Each RAM region 40 also includes PLCs that can be used to connect conductors 80' to the conductors 60 associated with the row that includes that RAM region.

RAM regions 40 may have a fixed depth and width configuration or may have a variable depth and width. A RAM region 40 that uses a fixed depth and width configuration is shown as memory region 200 in FIG. 2. Memory region 200 has memory array 202 for storing data from various portions of the circuitry of programmable logic device 10. Memory array 202 is preferably a 32 row by 64 column array of RAM cells.

Data input signals D to be written into memory array 202 are supplied at data input 204. Write 20 bit line generator 206 generates corresponding write bit line signals W that are supplied to the columns of memory array 202 via write bit lines 208. Buffered read bit line selector 210 accepts buffered read bit line signals R on read bit lines 212 and provides a selected group of these signals as data output signals Y at data output 214.

Columns in memory array 202 are addressed using column address decoder 216 and column select line generator 218. Rows in memory array 202 are addressed using row address decoder 220 and word line generator 222.

Column address decoder 216 accepts column address control signals at input 224 and generates corresponding decoded column address signals C at output 226. The three column address control signals supplied to input 224 are sufficient to specify the states of the eight decoded column address signals C. Column select line generator 218 accepts the eight decoded column address signals C at input 228 and a transpose enable signal TE at input 230 and a generates 64 corresponding column select signals S on column select lines 232. In operation, eight of the column select signals S go high in parallel.

The transpose enable signal TE is supplied at transpose enable input 234. If TE is low, memory array 202 is accessed using nontransposed words. If TE is high, memory array 202 is accessed using transposed words. Memory region 200 therefore allows data to be written to and read from memory array 202 in either the nontransposed or the transposed mode depending on the state of the transpose enable signal. Because memory region 200 allows data to be accessed in either a transposed or nontransposed format, certain operations such as data format conversion, matrix transposition, and computer graphics operations can be performed more efficiently than would otherwise be possible.

Row address decoder 220 accepts row address control signals at input 236 and generates corresponding decoded row address signals on lines 238. The five row address control signals supplied to input 236 are sufficient to specify the states of the 32 decoded row address signals. Only one row of memory array 202 is addressed at a time. Word line generator 222 accepts the 32 decoded row address signals on lines 238 and read enable and write enable signals at inputs 240 and 242. When the read enable signal is high, word line generator 222 accepts the decoded row address signal that is high and generates a corresponding high read word line signal on one of the 32 read word lines 244. When the write enable signal is high, word line generator 222 accepts the decoded row address signal that is high and generates a corresponding high write word line signal on one of the 32 write word lines 246. The write enable and read enable signals should not be held high at the same time.

Figure 2:
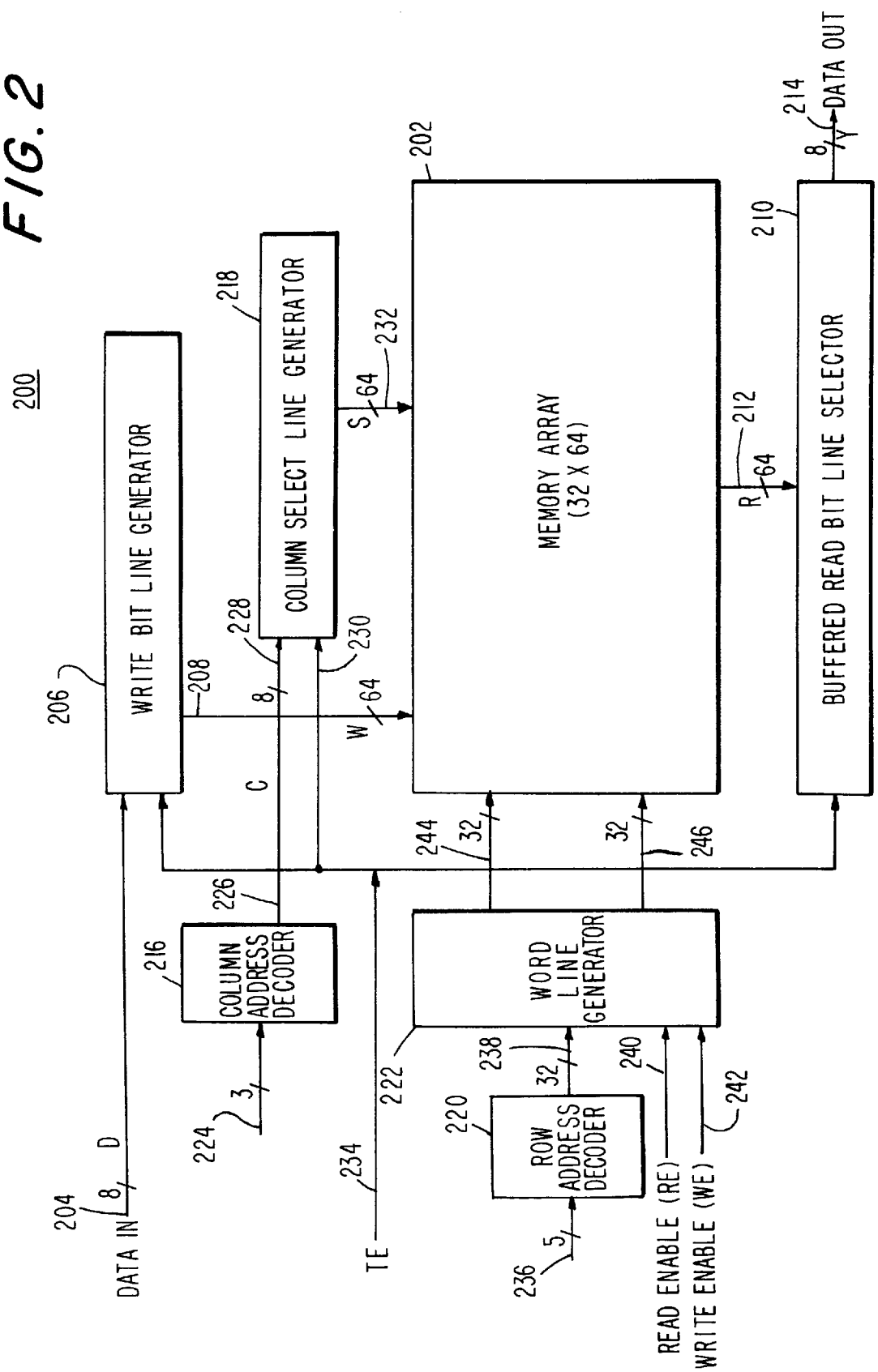
FIG. 2 is a diagram of a memory region having a fixed depth and width memory array in accordance with the present invention.
Figure 3:
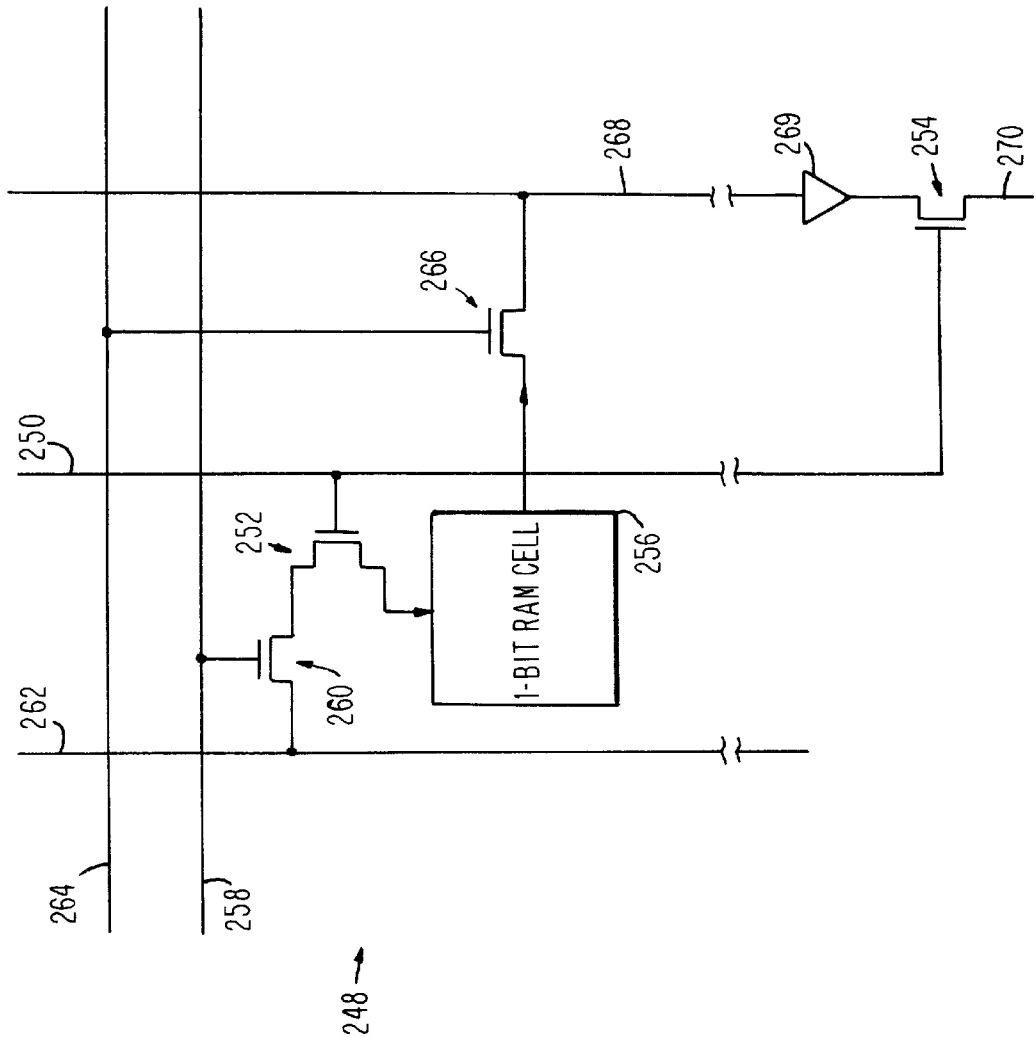
FIG. 3 is a diagram of a memory cell.

A memory cell 248 suitable for use in memory array 202 is shown in FIG. 3. Columns in memory array 202 are addressed by taking a column select line 250 high in the desired column of memory array 202. (Column select line 250 is one of column select lines 232 in FIG. 2.) Taking column select line 250 high turns on transistors 252 and 254.

To write data into RAM cell 256, write word line 258 is taken high in the desired row of memory array 202. (Write word line 258 is one of write word lines 246 in FIG. 2.) Taking write word line 258 high turns on transistor 260. Write bit line 262 (one of write bit lines 208 in FIG. 2) supplies the write bit line signal W to be stored in RAM cell 256. Because transistors 260 and 252 are on, the write bit line signal W is stored by RAM cell 256. Read word line 264 (one of read word lines 244 in FIG. 2) is held low while data is being written into RAM cell 256.

To read data from RAM cell 256, read word line 264 is taken high while write word line 258 is held low. Taking read word line 264 high turns on transistor 266 and allows the contents of RAM cell 256 to be read out via read bit line 268. Buffer 269 supplies a buffered version of the signal on read bit line 268 on buffered read bit line 270. Buffered read bit line 270 (one of buffered read bit lines 212 in FIG. 2) supplies the buffered read bit line signal R to buffered read bit line selector 210 (FIG. 2) from which a corresponding data output is provided on data output 214.

Figure 4:
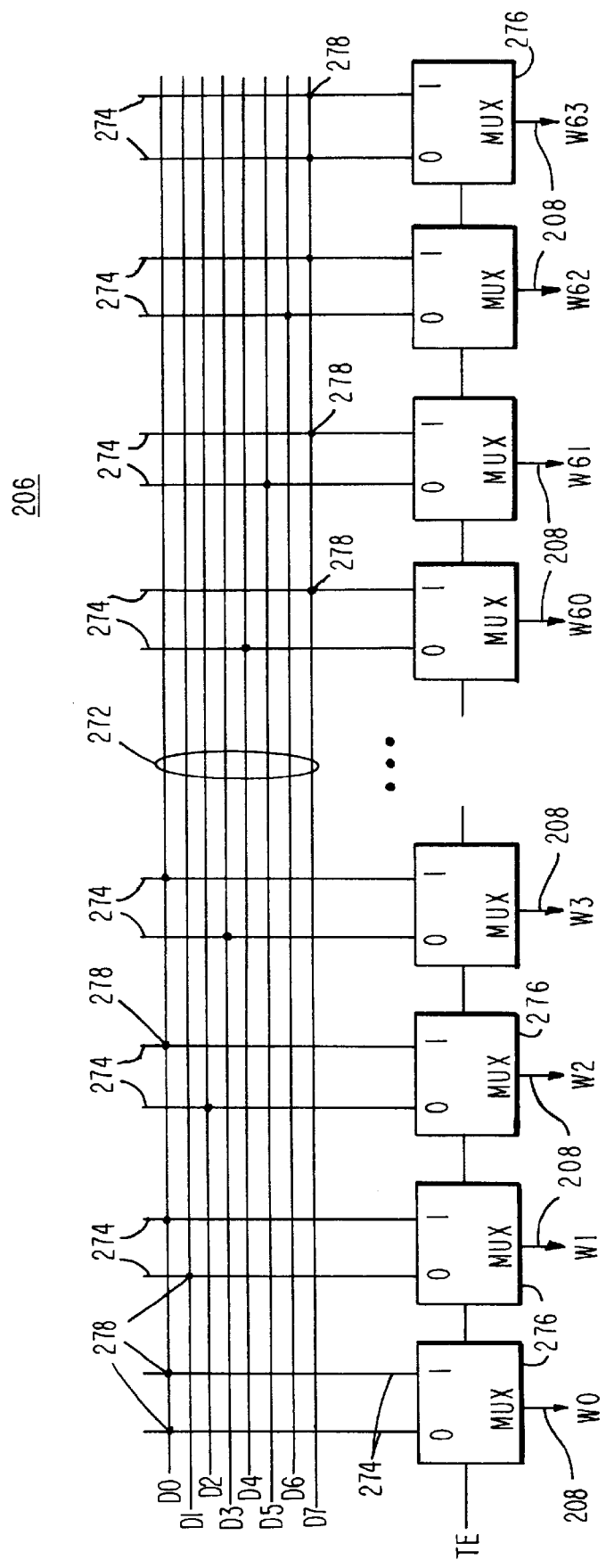
FIG. 4 is a diagram of the write bit line generator of FIG. 2.

The circuitry in write bit line generator 206 is shown in more detail in FIG. 4. Data input signals D0–D7 are supplied on data input lines 272 (which are connected to input 204 in FIG. 2). A pair of vertical lines 274 is associated with each column of memory array 202 (FIG. 2). Each pair of vertical lines 274 is connected to a 2:1 multiplexer 276. When the transpose enable signal TE is low, the left line 274 in each pair is connected to the write bit line 208 connected to the output of the multiplexer 276 for that pair. When the transpose enable signal TE is high, the right line 274 in each pair is connected to the write bit line 208 connected to the output of the multiplexer 276 for that pair.

A pattern of fixed connections 278 between data input lines 272 and vertical lines 274 is used to route data input signals D0–D7 to write bit lines 208. When TE is high, data input signals D0–D7 are directed to one group of write bit lines 208, whereas when TE is low, input signals D0–D7 are directed to another group of write bit lines 208. As a result, data is written into memory array 202 in a nontransposed format when TE is low and a transposed format when TE is high.

A mathematical description of the arrangement of FIG. 4 is given by Equation 1.

$$W[k]=!TE*D[k \bmod 8]+TE*D[k/8] \qquad (1)$$

The variable k is an index for the columns of memory array 202. The value of k ranges from 0 (for the first column of memory array 202) to 63 (for the sixty-fourth column of memory array 202. W[k] are the write bit line signals on write bit lines 208. For example, W[1] is the write bit line signal for the write bit line 208 in the second column of memory array 202, as shown in FIG. 4. TE is 1 when memory array 202 is in the transposed mode and 0 in the nontransposed mode. The symbol "!" represents a logical NOT function. The symbol "*" represents the logical AND function and the symbol "+" represents a logical OR function. The expression "k/8" represents integer division of index k by 8. Integer division is division in which the result is equal to the quotient of the numerator divided by the denominator (i.e., the decimal place is ignored). For example, 2/8 is 0 and 17/8 is 2. The abbreviation "mod" stands for the well-known modulo function. The operation a mod b involves determining the remainder of the division of a by b. For example, 2 mod 8 is 2 and 17 mod 8 is 1. D are the data input signals on data input lines 272. For example, D[0] is the data input signal on the top data input line 272 in FIG. 4.

Equation 1 specifies which write bit line signals W are provided on write bit lines 208 as a function of the data input signals D that are provided on data input lines 272. In addition, Equation 1 shows how different groups of signals are provided on write bit lines 208 depending on the state of multiplexers 276. In the nontranspose mode (TE=0), Equation 1 reduces to Equation 2.

$$W[k]=D[k \bmod 8] \qquad (2)$$

Equation 2 shows that the pattern of fixed connections 278 in FIG. 4 maps the eight bit group of data input signals (D0, D1, . . . , D7) to the eight bit group of write bit line signals (W0, W1, . . . , W7). The eight bit group of signals (D0, D1, . . . , D7) is also mapped to seven other eight bit groups of write bit line signals: (W8, W9, . . . , W15), (W16, W17, . . . , W23), (W24, W25, . . . , W31), (W32, W33, . . . , W39), (W40, W41 . . . , W47), (W48, W49 . . . , W55), and (W56, W57, . . . , W63). Each of these eight bit groups of data signals is applied to write bit lines 208 of memory array 202. However, only eight bits of data are written into memory array 202 at a time. Eight column select signals S are applied to memory array 202 to specify which eight bit group of the 64 RAM cells 256 in a row are to receive the data signals D0, D1, . . . D7. A write word line signal specifies which row of RAM cells 256 is to accept data.

In the transpose mode (TE=1), Equation 1 reduces to Equation 3.

$$W[k]=D[k/8] \qquad (3)$$

Equation 3 shows that the pattern of fixed connections 278 in FIG. 4 maps the eight bit group of signals (D0, D1, . . . , D7) to the eight bit group of write bit line signals (W0, W8, ..., W56). The eight bit group of signals (D0, D1, ..., D7) is also mapped to seven other eight bit groups of write bit line signals: (W1, W9, ..., W57), (W2, W10, ..., W58), (W3, W11, ..., W59), (W4, W12, ..., W60), (W5, W13 ..., W61), (W6, W14 ..., W62), and (W7, W15, ..., W63). Although each of these eight bit groups of data signals is applied to write bit lines 208 of memory array 202, only eight bits of data are written into memory array 202 at a time. The eight bit group of RAM cells 256 to receive the data signals D0, D1, ... D7 is specified by eight column select signals S. A write word line signal specifies which row of RAM cells 256 is to accept data.

The relationships described by Equations 2 and 3 show that data input signals D0–D7 are mapped onto write bit lines 208 in various different patterns depending on whether data words are being supplied to memory array 202 in the transposed mode (TE=1) or the nontransposed mode (TE=0). These relationships can be illustrated by constructing a 2×2 matrix with elements that represent the memory cells or bits of a single row of memory array 202.

Such a 2×2 matrix 280 is shown in FIG. 5. Matrix 280 has 64 elements corresponding to the 64 cells or bits in each row of memory array 202. The elements are arranged in virtual rows and virtual columns. In the nontransposed mode (TE=0), the eight bit group of data input signals (D0, D1, ... D7) is mapped to the groups of write bit lines 208 associated with the virtual rows of cells shown in matrix 280. For example, the eight data input signals D0–D7 are mapped to the first group of write bit line signals W0, W1, ... W7 as shown by the cell numbers 0, 1, ..., 7 in virtual row 0 of matrix 280. In the transposed mode (TE=0), the eight bit group of data input signals (D0, D1, ..., D7) is mapped to the groups of write bit lines 208 associated with the virtual columns of cells shown in matrix 280. For example, the eight data input signals D0–D7 are mapped to the first group of write bit line signals W0, W8, ... W56 as shown by the cell numbers 0, 8, ..., 56 in virtual column 0 of matrix 280.

Figure 6:
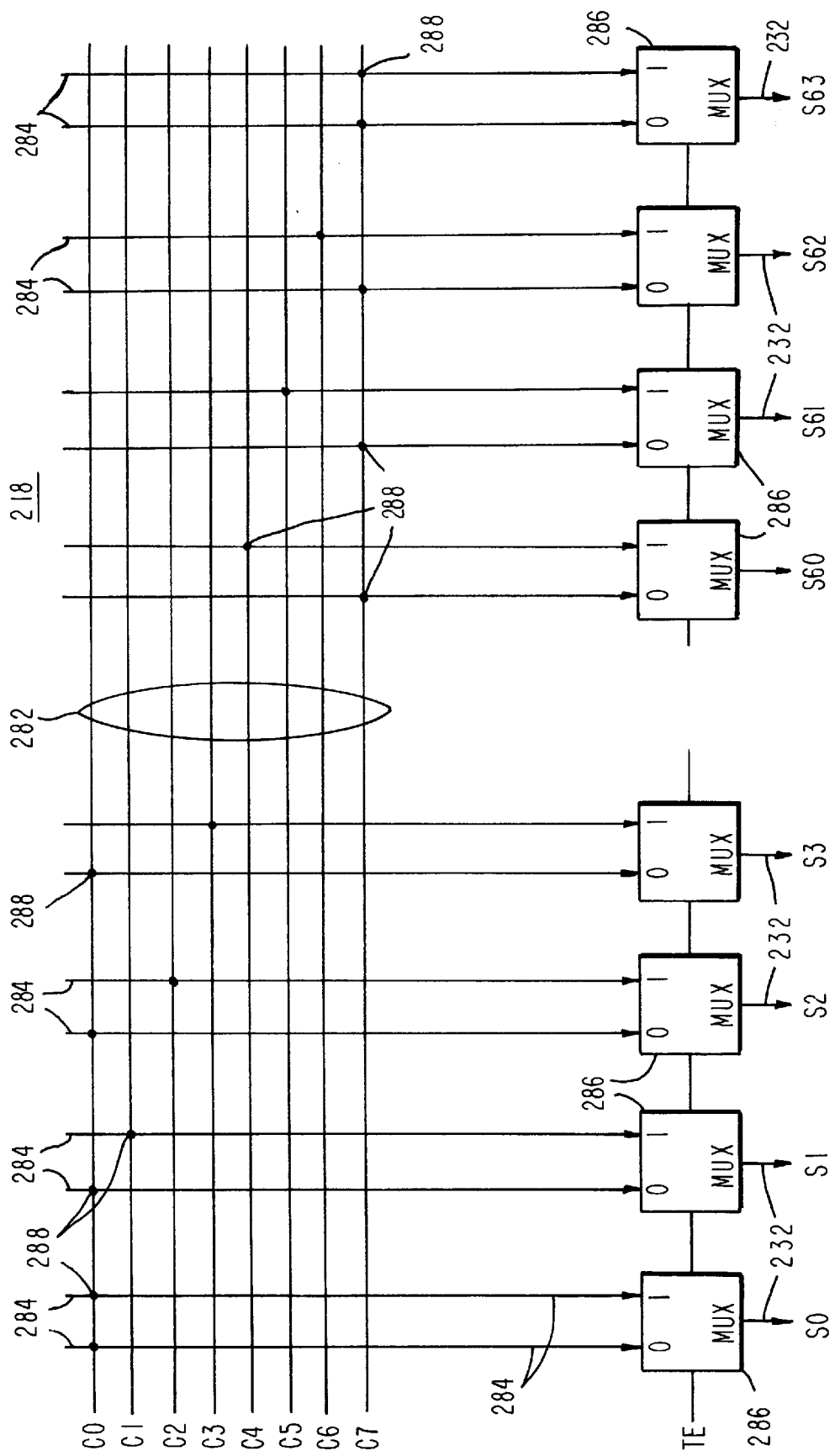
FIG. 6 is a diagram of the column select line generator of FIG. 2.

The matrix representation of FIG. 5 illustrates which groups of write bit line signals (W) are activated by the group of data input signals (D). To determine which data bits are actually written into memory cells 248 of memory array 202, it is also necessary to establish which column select lines 232 are taken high during the write operation. The circuitry in column select line generator 218 is shown in FIG. 6. Decoded column address signals (C0–C7) are supplied on column address lines 282 (connected to input 228 in FIG. 2). A pair of vertical lines 284 is associated with each column of memory array 202 (FIG. 2). Each pair of vertical lines 284 is connected to a 2:1 multiplexer 286. When the transpose enable signal TE is low, the left line 284 in each pair is connected to the column select line 232 connected to the output of the multiplexer 286 for that pair. When the transpose enable signal TE is high, the right line 284 in each pair is connected to the column select line 232 connected to the output of the multiplexer 286 for that pair.

A pattern of fixed connections 288 between column address lines 282 and vertical lines 284 is used to connect column address lines 282 (C0–C7) to column select lines 232. In operation, only one decoded column address signal C goes high at a time. This column address signal is distributed to a group of eight column select lines 232 by the pattern of fixed connections 288. The group of column select lines 232 that are activated in response to a given decoded column address signal also depends on the state of the transpose enable bit (TE). For example, if C0 is taken high while TE is low, the group of column select signals S0, S1, ..., S7 will go high, whereas if C0 is taken high while TE is high, the group of column select signals S0, S8, ..., S56 will go high.

During the writing process, a single row of memory cells is selected by taking one of write word lines 246 (FIG. 2) high. In order for a memory cell 248 (FIG. 3) in the selected row to accept data from one of write bit lines 208 (FIG. 2), the column select line 232 (FIG. 2) for that memory cell 248 (FIG. 3) must go high. As a result, when one of the decoded column address signals C goes high, only the eight memory cells 248 in the selected row that correspond to the eight column select lines 232 in that row that go high will be able to accept data from the write bit lines 208. The input data signals D that are written into those eight cells are determined by the pattern of write bit line signals W described by Equation 1.

A mathematical description of the relationship between the decoded column address signals C0–C7 provided on column address lines 282 and the resulting column select signals S0–S63 on column select lines 232 is given by Equation 4.

$$S[k]=!TE*C[k/8]+TE*C[k \bmod 8] \quad (4)$$

The variable k is an index (0 to 63) for the columns of memory array 202. S[k] are the column select signals. For example, S[1] is the column select signal for the column select line 232 in the second column of memory array 202, as shown in FIG. 6. TE is 1 for the transposed mode and 0 for the nontransposed mode. The symbol "!" represents a logical NOT function. The expression "k/8" represents integer division of index k by 8 and the abbreviation "mod" stands for the modulo function. C are the decoded column address signals on column address lines 282. For example, C[0] is the decoded column address data input signal on the top column address line 282 in FIG. 6.

Equation 4 specifies which eight column select lines 232 are driven high when one of the column address lines 282 is taken high. In addition, Equation 4 shows how different groups of column select lines are driven high depending on the state of multiplexers 286.

In the nontransposed mode (TE=0), Equation 4 reduces to Equation 5.

$$S[k]=C[k/8] \quad (5)$$

Equation 5 shows that when C0 is taken high in the nontransposed mode, the eight column select signals S0, S1, ..., S7 are driven high. Seven other groups of column select signals are driven high when each of the remaining seven decoded column address signals C1–C7 are taken high: (S8, S9, ..., S15), (S16, S17, ..., S23), (S24, S25, ..., S31), (S32, S33, ..., S39), (S40, S41 ..., S47), (S48, S49 ..., S55), and (S56, S57, ..., S63). A single write word line signal is taken high to select the row into which data is written. Each of the groups of eight column select signals defines an eight bit group of memory cells 248 for the selected row into which a data word can be written from data input lines 272.

In the transpose mode (TE=1), Equation 4 reduces to Equation 6.

$$S[k]=C[k \bmod 8] \quad (6)$$

Equation 6 shows that when C0 is taken high in the transposed mode, the eight column select signals S0, S8, ..., S56 are driven high. Seven other groups of column select signals are driven high when each of the remaining seven decoded column address signals C1–C7 are taken high: (S1, S9, . . . , S57), (S2, S10, . . . , S58), (S3, S11, . . . , S59), (S4, S12, . . . , S60), (S5, S13 . . . , S61), (S6, S14 . . . , S62), and (S7, S15, . . . , S63). A single write word line signal is taken high to select the row into which data is written. Each of the groups of eight column select signals defines an eight bit group of memory cells 248 for the selected row into which a data word can be written from data input lines 272.

The relationships described by Equations 5 and 6 show that the data words stored in a given row of memory array 202 are either stored as groups of adjacent cells or regularly spaced nonadjacent cells depending on whether data words are being supplied to memory array 202 in the transposed mode (TE=1) or the nontransposed mode (TE=0). These relationships can be illustrated using matrix 280 of FIG. 5.

Matrix 280 of FIG. 5 shows which memory cells 248 in a given row receive data during the process of writing a data word into memory array 202. In the nontransposed mode, the data word made up of data input signals D0, D1, . . . D7 is stored in one of the groups of memory cells 248 associated with the virtual rows of cells shown in matrix 280. In the transposed mode, the data word made up of data input signals D0, D1, . . . , D7 is stored in one of the groups of memory cells 248 associated with the virtual columns of cells shown in matrix 280.

For example, if C0 is taken high in the nontransposed mode, the eight data input signals D0, D1, . . . , D7 that were mapped to the group of write bit line signals W0, W1, . . . W7 are written into cells 0, 1, . . . , 7 in virtual row 0 of matrix 280. If C3 is taken high in the nontransposed mode, the eight data input signals D0, D1, . . . , D7 that were mapped to the group of write bit line signals W24, W25, . . . W31 are written into cells 24, 25, . . . , 31 in virtual row 3 of matrix 280. In contrast, if C0 is taken high in the transposed mode, the eight data input signals D0, D1, . . . , D7 that were mapped to the group of write bit line signals W0, W8, . . . W56 are written into cells 0, 8, . . . , 56. If C3 is taken high in the transposed mode, the eight data input signals D0, D1, . . . , D7 that were mapped to the group of write bit line signals W3, W11, . . . W59 are written into cells 3, 11, . . . , 59.

Regardless of whether data is written into memory array 202 in the transposed or nontransposed mode data is written to the same physical row in memory array 202. The row into which data is written is the row selected by the single write word line 246 from word line generator 222 to go high during the write operation.

Figure 7:
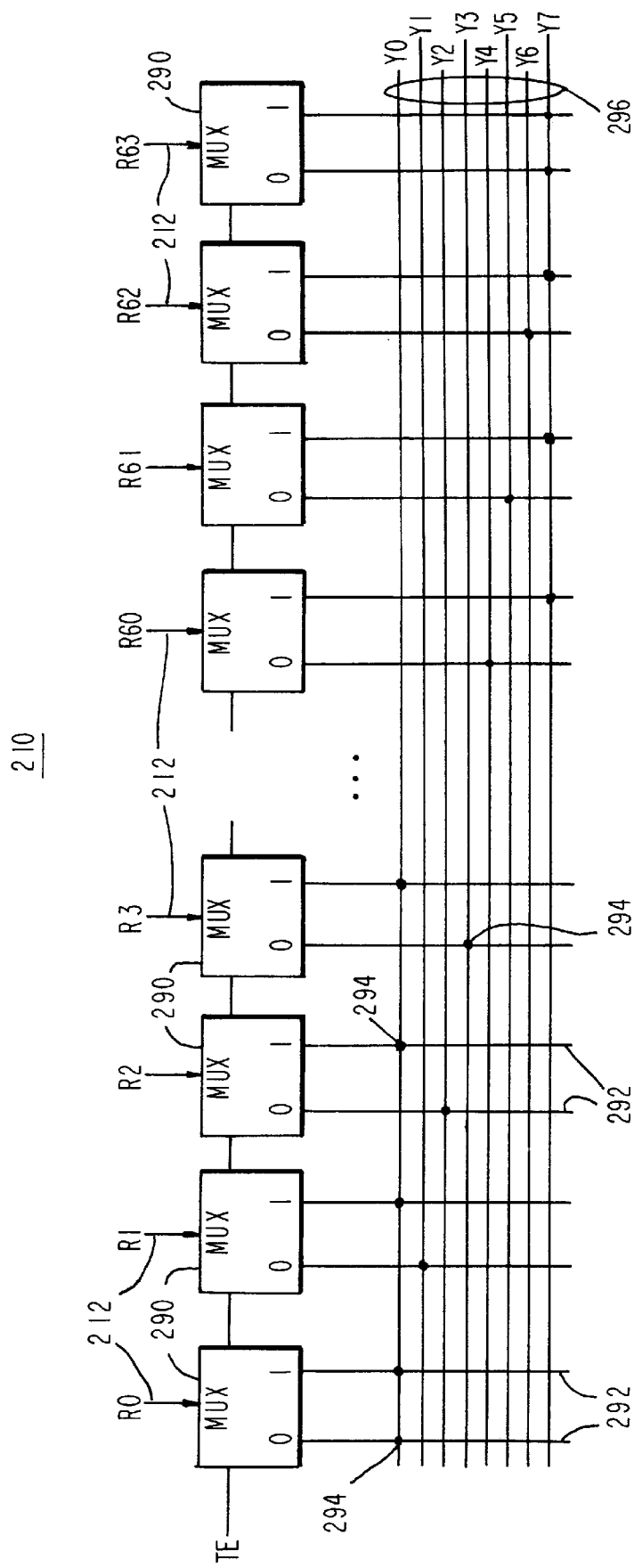
FIG. 7 is a diagram of the buffered read bit line selector of FIG. 2.

In addition to writing data words into memory array 202 in either a transposed or nontransposed format, data is read out of memory array 202 in either a transposed or nontransposed format. The circuitry of buffered read bit line selector 210 that is used to read out data from memory array 202 is shown in FIG. 7. Buffered read bit line selector 210 has 64 1:2 demultiplexers 290 corresponding to the 64 columns of memory array 202. Demultiplexers 290 are controlled by the transpose enable signal TE. Each demultiplexer 290 has an input connected to one of the read bit lines 212 for accepting an associated buffered read bit line signal R from memory array 202. One row of memory array 202 is addressed at a time by taking one of read word lines 244 high. The buffered read bit line signals R provided to demultiplexers 290 are therefore representative of data stored in memory cells 248 in the selected row of memory array 202.

Each demultiplexer has two outputs, which are connected to a pair of vertical lines 292. A pattern of fixed connections 294 connects vertical lines 292 to data output lines 296, which are connected to data output 214 of FIG. 2. Data output lines 296 provide data output signals Y0–Y7 to data output 214. Data signals to be read out are routed from memory array 202 to data output lines 296 during the read operation in much the same way that data signals to be written are routed from data input lines 272 to memory array 202.

The pattern of fixed connections 294 shown in FIG. 7 maps various groups of buffered read bit line signals R to the data output signals Y0–Y7. Different groups of buffered read bit line signals are mapped depending on whether TE=1 (transposed mode) or TE=0 (nontransposed mode). The bits that are read out of memory array 202 are determined by the mapping of buffered read bit line signals to data output signals provided by the buffered bit line selector 210 and by the states of the column select lines 232. Although many buffered read bit lines 212 are connected to each data output line 296, during a read operation only one buffered read bit line signal is active at a time on each data output line 296.

Equation 7 shows how buffered read bit line signals R0–R63 are mapped to data output line signals Y0–Y7.

$$Y[k] = !TE * \sum_{i=0}^{7} R[8i + k] + TE * \sum_{i=0}^{7} R[8k + i] \qquad (7)$$

The summation signs in Equation 7 represent repeated logical OR operations. The "+" inside of the brackets is regular addition. Outside of the brackets, the "+" indicates the logical OR function.

Equation 7 can be reduced to Equation 8 in the nontransposed mode.

$$Y[k] = \sum_{i=0}^{7} R[8i + k] \qquad (8)$$

Equation 8 shows, for example, that in the nontransposed mode buffered read bit line signals R0, R8, . . . , R56 are all mapped to data output signal Y0. Equation 7 also defines how seven other groups of eight buffered read bit line signals are mapped to each of the other seven data output signals Y1–Y7 in the nontransposed mode.

Equation 7 can be reduced to Equation 9 in the transposed mode.

$$Y[k] = \sum_{i=0}^{7} R[8k + i] \qquad (9)$$

Equation 9 shows, for example, that in the transposed mode buffered read bit line signals R0, R1, . . . , R7 are all mapped to data output signal Y0. Equation 9 also defines how seven other groups of eight buffered read bit line signals are mapped to each of the other seven data output signals Y1–Y7 in the transposed mode.

The relationships of Equations 8 and 9 can be understood with reference to matrix 280 of FIG. 5. Each virtual row in matrix 280 represents a data output signal Y in the transposed mode. The entries in each virtual row are the buffered read bit line signals that are mapped to the data output signal for that virtual row. For example, virtual row 2 corresponds to data output signal Y2. The entries in virtual row 2 show that buffered read bit line signals R16, R17, . . . , R23 are mapped to Y2 in the transposed mode.

Each virtual column in matrix 280 corresponds to a data output signal Y in the nontransposed mode. The entries in each virtual column are the buffered read bit line signals that are mapped to the data output signal for that virtual column. For example, virtual column 2 corresponds to data output signal Y2. The entries in virtual column 2 show that buffered read bit line signals R2, R10, . . . , R58 are mapped to Y2 in the nontransposed mode.

During a read operation, one row in memory array 202 is selected by taking one of read word lines 244 high. Although eight buffered read bit lines 212 are connected to each data output line 296 (through buffered read bit line selector 210), only one of the eight buffered read bit lines 212 corresponds to a column with an active column select signal. As a result, only a single data bit from memory array 202 is provided on each data output line 296.

Matrix 280 of FIG. 5 shows which data bits are read out of a selected row as the data output word Y0–Y7. In the transposed mode (TE=1), the data word read out of memory array 202 is associated with one of the virtual columns of cells shown in matrix 280. In the nontransposed mode (TE=0), the data word read out of memory array 202 is associated with one of the virtual rows of cells shown in matrix 280.

For example, if C0 is taken high in the transposed mode, column select signals S0, S8, . . . , S56, which correspond to the entries in virtual column 0, are driven high. Driving S0, S8, . . . , S56 high causes the data stored in cells 0, 8, . . . , 56 in the selected row of memory array 202 to be passed to buffered read bit line selector 210 as buffered read bit line signals R0, R8, . . . , R56. Each of these signals is mapped to a respective data output line 296, so that the data word made up of outputs Y0–Y7 contains the data bits from cells 0, 8, . . . , 56 (i.e., the entries in virtual column 0).

In contrast, if C0 is taken high in the nontransposed mode, column select signals S0, S1, . . . , S7, which correspond to the entries in virtual row 0, are driven high. Driving S0, S1, . . . , S7 high causes the data stored in cells 0, 1, . . . , 7 in the selected row of memory array 202 to be passed to buffered read bit line selector 210 as buffered read bit line signals R0, R1, . . . , R7. Each of these signals is mapped to a respective data output line 296, so that the data word made up of outputs Y0–Y7 contains the data bits from cells 0, 1, . . . , 7 (i.e., the entries in virtual row 0).

A memory array with a fixed word size can be accessed in either a transposed mode or a nontransposed mode using the arrangement shown in FIG. 2. If desired, a memory array with a variable word size can be accessed similarly. An illustrative RAM region 40 that uses a variable word size is shown as memory region 298 in FIG. 8. Data from various portions of the circuitry of programmable logic device 10 (FIG. 1) is stored in memory array 300, which is preferably a 32 row by 64 column array of RAM cells.

Data input signals D to be written into memory array 300 are supplied at data input 302. Write bit line generator 304 generates corresponding write bit line signals W that are supplied to each of the columns of memory array 300 via write bit lines 306. Buffered read bit line selector 308 accepts buffered read bit line signals R on read bit lines 310 and provides a selected group of these signals as data output signals Y at data output 312.

Columns in memory array 300 are addressed using column address control logic 314, column address decoder 316, and column select line generator 318. Rows in memory array 300 are addressed using row address decoder 320 and word line generator 322.

Column address control logic 314 accepts six column address signals A at input 324 and provides a corresponding group of six adjusted column address signals B on lines 326. Various control signals are provided to column address control logic 314, write bit line generator 304, column select line generator 318, and buffered read bit line selector 308 via lines 328. Control signal TE determines whether data is accessed in memory array 300 in the transposed or nontransposed mode. Control signal TE is preferably generated as an output of the logic circuitry of programmable logic device 10 or may be obtained from an output pin. Control signals M1, M2, M4, and M8 control the width of the data word used to access memory array 300. Control signals M1, M2, M4, and M8 may be stored by functional control elements (i.e., electrically-erasable programmable read-only transistor cells, RAM cells, etc.), which are configured when programmable logic device 10 is programmed. When M8 is high, memory region 298 operates in a ×8 mode in which data is accessed in memory array 300 using eight-bit words. When M4 is high, memory region 298 operates in a ×4 mode in which data is accessed in memory array 300 using four-bit words. When M2 is high, memory region 298 operates in a ×2 mode in which data is accessed in memory array 300 using two-bit words. When M1 is high, memory region 298 operates in a ×1 mode in which data is accessed in memory array 300 using one-bit words.

The adjusted column address signals B that are provided by column address control logic 314 are determined by the states of the control signals M1, M2, M4, and M8. In the ×1 mode (M1 high), all six column address signals A are mapped to associated adjusted column address signals B. Six adjusted column address signals B are needed to specify a single column from among 64 ($2_6$) possible columns in memory array 300. In the ×2 mode (M2 high), five of the column address signals A are mapped to associated adjusted column address signals B and the sixth adjusted column address signal B is held at a suitable fixed value (e.g., it is held low). In the ×4 mode (M4 high), four column address signals A are mapped to associated adjusted column address signals B and two adjusted columns address signals B are held at a suitable fixed value. In the ×8 mode (M8 high), three column address signals A are mapped to associated adjusted column address signals B and three adjusted column address signals B are held at a suitable fixed value.

Columns address decoder 316 accepts the adjusted column address control signals on lines 326 and generates corresponding decoded column address signals C on lines 330. Only a single decoded address signal is taken high at a time during a read or write operation. The six adjusted column address signals B supplied to column address decoder 316 are sufficient to specify that particular signal from among the 64 decoded column address signals C on line 330. The decoded column address signal C that is taken high is received by column select line generator 318, which generates one or more corresponding column select signals S on column select lines 332. The number of column select signals S that are taken high by column select line generator 318 depends on the mode selected by the mode control signals M1, M2, M4, and M8. In the ×1 mode, one column select line 332 is taken high, thereby addressing a single column of memory array 300. In the ×2, ×4, and ×8 modes, two, four, and eight column select lines are respectively taken high in parallel.

The transpose enable signal TE determines the way in which data is accessed in memory array 300. If TE is 0, memory array 300 is accessed using nontransposed words. If TE is 1, memory array 300 is accessed using transposed words. Memory region 298 therefore allows data to be written to and read from memory array 300 in either a nontransposed or a transposed mode. Operations such as data format conversion, matrix transposition, and computer graphics operations can be performed more efficiently using the arrangement of memory region 298 than would be possible without the transpose enable feature.

Row address decoder 322 accepts row address control signals at input 334 and generates corresponding decoded row address signals on lines 336. The five row address control signals supplied to input 334 are sufficient to specify the states of the 32 decoded row address signals. Only one row of memory array 300 is selected at a time. Word line generator 322 accepts the 32 decoded row address signals on lines and read enable and write enable signals at inputs 338 and 340. When the read enable signal is high, word line generator 322 accepts the decoded row address signal that is high and generates a corresponding high read word line signal on one of the 32 read word lines 342. When the write enable signal is high, word line generator 322 accepts the decoded row address signal that is high and generates a corresponding high write word line signal on one of the 32 write word lines 344.

Figure 8:
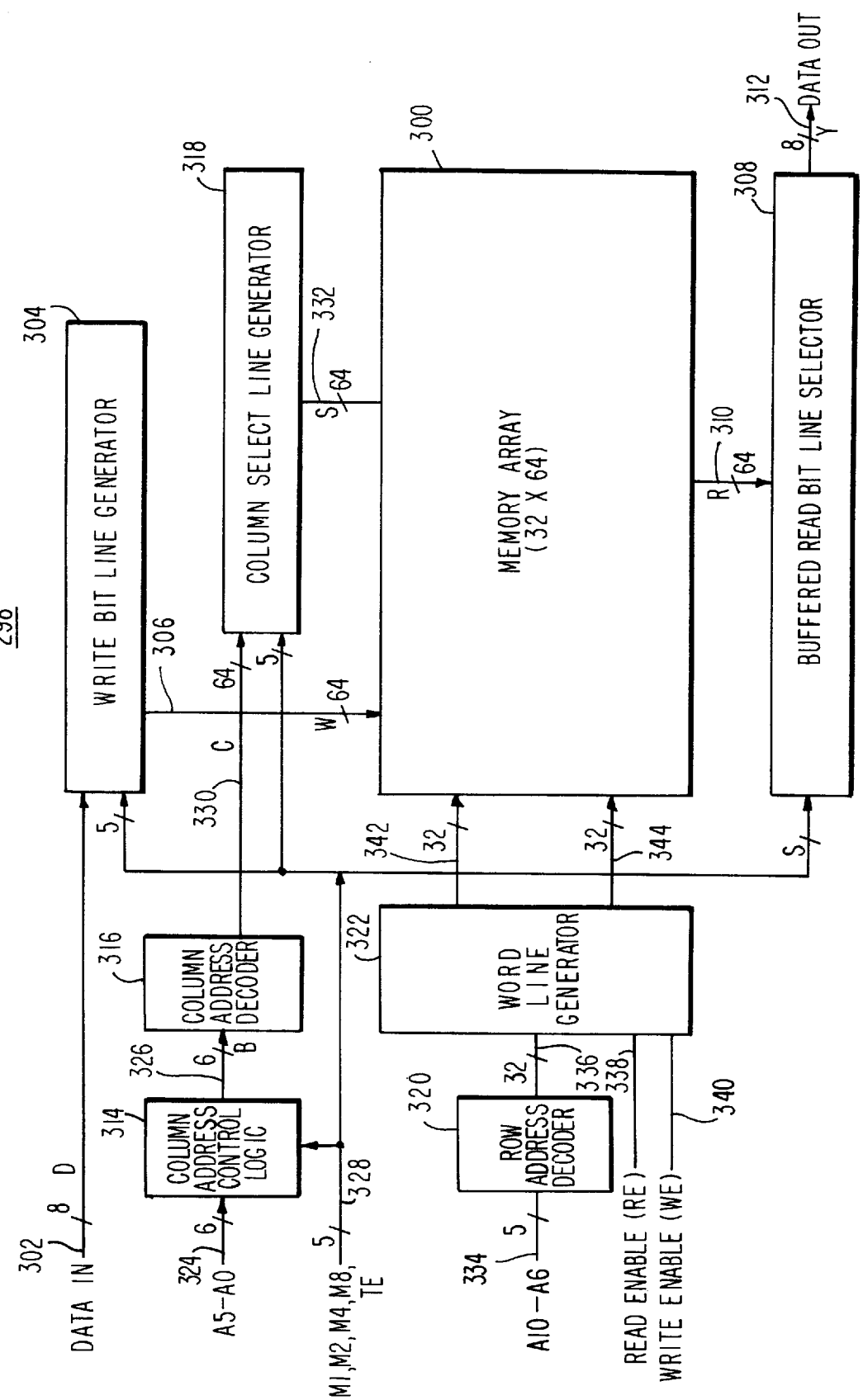
FIG. 8 is a diagram of a memory region having a variable depth and width memory array in accordance with the present invention.

Memory cells such as memory cell 248 of FIG. 3 can be used in memory array 300. Columns in memory array 300 are addressed by taking a column select line 332 high in the desired column of memory array 300. When memory cell 248 is used in memory array 300, column select line 250 (FIG. 3) is one of column select lines 332 (FIG. 8), write bit line 262 (FIG. 3) is one of write bit lines 306 (FIG. 8), buffered read bit line 270 (FIG. 3) is one of buffered read bit lines 310 (FIG. 8), read word line 264 (FIG. 3) is one of read word lines 342 (FIG. 8), and write word line 258 (FIG. 3) is one of write word lines 344 (FIG. 8). Data is written to and read from memory cell 248 of FIG. 3 in the same way regardless of whether memory cell 248 is part of memory array 202 or memory array 300.

The circuitry used to access data in memory array 300 allows memory array 300 to be configured with a varying depth and width. The width of memory array 300 corresponds to the size of the data words used to write data into memory array 300 and the size of the data words used to read data from memory array 300. The depth of memory array 300 refers to the amount of memory available for a selected width. For example, a 2K memory array 300 could be configured either as a memory with a width of 2 and a depth of 1K or with a width of 8 and a depth of 256.

Figure 9:
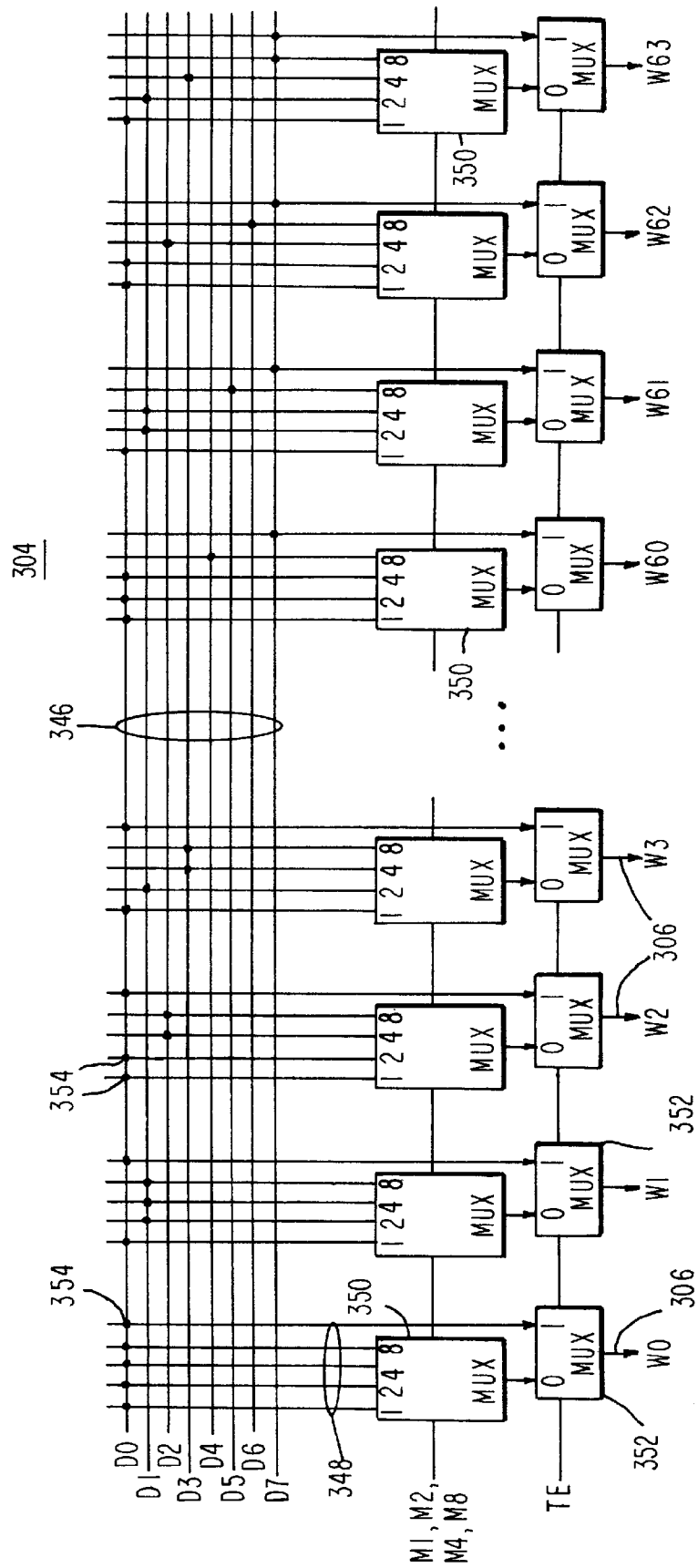
FIG. 9 is a diagram of the write bit line generator of FIG. 8.

The circuitry in write bit line generator 304 is shown in FIG. 9. Data input signals D0–D7 are supplied on data input lines 346. Groups of five vertical lines 348 are associated with each column of memory array 300 (FIG. 8). Four lines from each group of vertical lines 348 are connected to a 4:1 multiplexer 350 in each column. The output of each 4:1 multiplexer 350 and the fifth line from each group of vertical lines 348 are connected as inputs to one of 2:1 multiplexers 352. The outputs of multiplexers 352 are connected to write bit lines 306.

Multiplexers 350 are controlled by mode selection signals M1, M2, M4, and M8, which control the paths for routing signals in the ×1, ×2, ×4 and ×8 modes. In the ×1 mode, the vertical lines 348 at the "1" inputs of multiplexers 350 are passed to the outputs of multiplexers 350. In the ×2 mode, the vertical lines 348 at the "2" inputs of multiplexers 350 are passed to the outputs of multiplexers 350. In the ×4 mode, the vertical lines 348 at the "4" inputs of multiplexers 350 are passed to the outputs of multiplexers 350. In the ×8 mode, the vertical lines 348 at the "8" inputs are passed to the outputs of multiplexers 350.

The transpose enable signal TE controls whether data is written into memory array 300 via write bit lines 306 in the transposed mode or in the nontransposed mode. When TE is 0, the "0" inputs to multiplexers 352 are passed to write bit lines 306. When TE is 1, the "1" inputs to multiplexers 352 are passed to write bit lines 306.

A pattern of fixed connections 354 between data input lines 346 and vertical lines 348 is used to route data input signals D0–D7 to write bit lines 306. The way in which data inputs signals D0–D7 are routed to write bit lines 306 depends on whether the transposed or nontransposed mode is used. Data is written into memory array 202 in a nontransposed format when TE is low and a transposed format when TE is high.

When write bit line generator 304 is in the ×8 mode, selecting either the transposed mode or nontransposed mode allows eight bit data words to be written into memory array 300 in either a transposed or nontransposed format. In the nontransposed mode (TE=0), selecting the ×1, ×2, or ×4 modes determines the size (width) of the data words written into memory array 300.

A mathematical description of the arrangement of FIG. 9 is given by Equation 10.

$$W[k] = !TE*(M1*D[0] + M2*D[k \bmod 2] + M4*D[k \bmod 4] + M8*D[k \bmod 8]) + TE * D[k/8] \qquad (10)$$

The index k ranges from 0 to 63. W[k] are the write bit line signals. TE is 1 in the transposed mode and 0 in the nontransposed mode. The symbol "!" represents the logical NOT function. The expression "k/8" represents integer division of index k by 8. The abbreviation "mod" stands for the modulo function. D are the data input signals. M1, M2, M4, and M8 are mode selection control signals.

Equation 10 shows which groups of write bit line signals W are activated by the group of data input signals D. To determine which data bits are actually written into the memory cells of memory array 300, it is also necessary to establish which column select lines 332 are taken high during the write operation.

Figure 10:
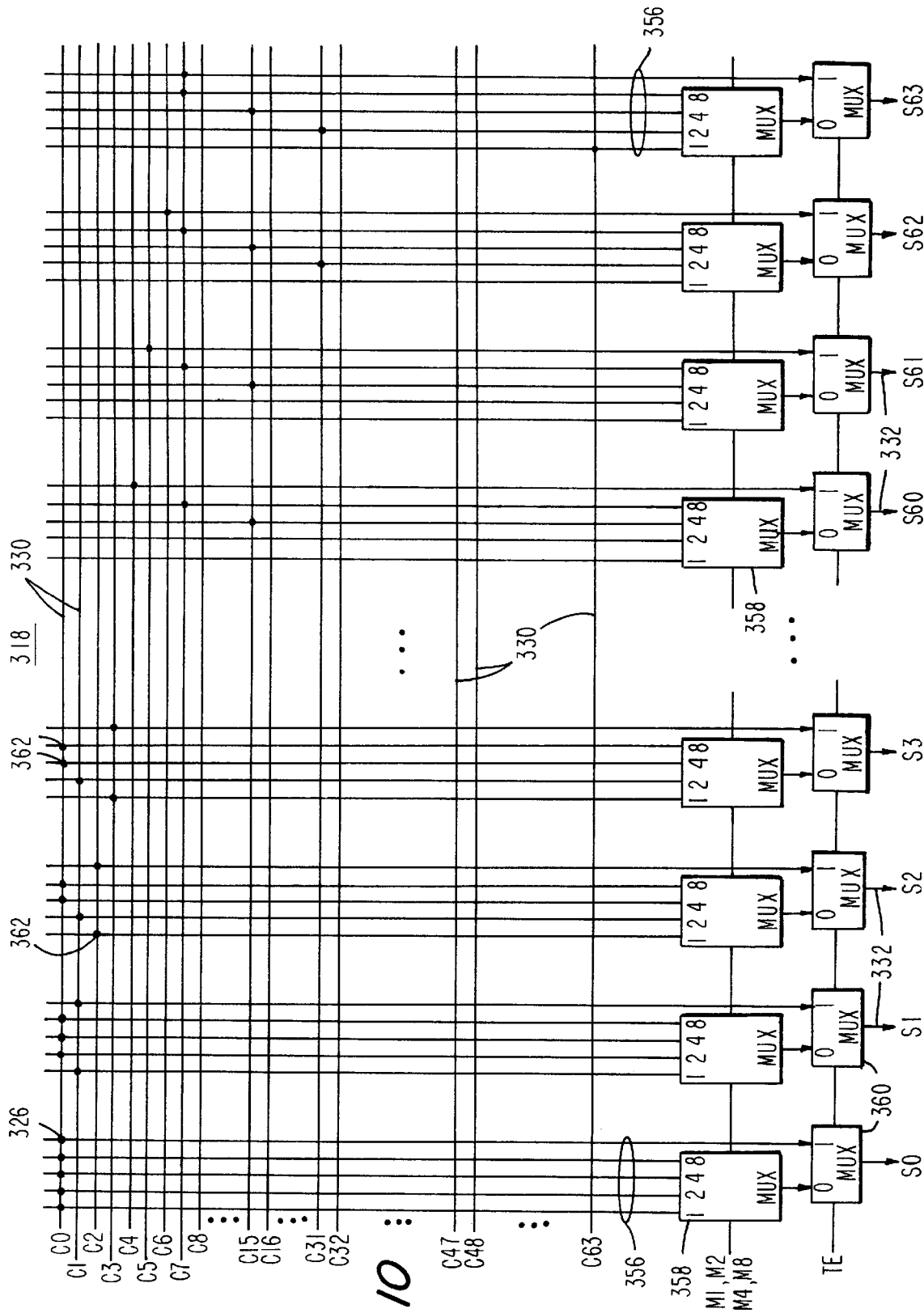
FIG. 10 is a diagram of the column select line generator of FIG. 8.

The circuitry in column select line generator 318 is shown in FIG. 10. Decoded column address signals (C0–C64) are supplied on column address lines 330. A group of five vertical lines 356 is associated with each column of memory array 300. Four lines from each group of vertical lines 356 are connected to a 4:1 multiplexer 358 in each column. The output of each 4:1 multiplexer 358 and the fifth line from each group of vertical lines 356 are connected as inputs to one of 2:1 multiplexers 360. The outputs of multiplexers 360 are connected to column select lines 332.

Multiplexers 358 are controlled by mode selection signals M1, M2, M4, and M8, which control the paths for routing signals in the ×1, ×2, ×4 and ×8 modes. In the ×1 mode, the vertical lines 356 at the "1" inputs of multiplexers 358 are passed to the outputs of multiplexers 358. In the ×2 mode, the vertical lines 356 at the "2" inputs of multiplexers 358 are passed to the outputs of multiplexers 358. In the ×4 mode, the vertical lines 356 at the "4" inputs of multiplexers 358 are passed to the outputs of multiplexers 358. In the ×8 mode, the vertical lines 356 at the "8" inputs are passed to the outputs of multiplexers 358.

The transpose enable signal TE controls whether data is accessed in the transposed mode or in the nontransposed mode. When TE is 0, the "0" inputs to multiplexers 360 are passed to column select lines 332. When TE is 1, the "1" inputs to multiplexers 360 are passed to column select lines 332.

A pattern of fixed connections 362 between decoded column address lines 330 and vertical lines 356 is used to map decoded column address signals C0–C63 to column select signals S0–S63 on column select lines 332. The way in which decoded column address signals C0–C63 are mapped to column select signals S0–S63 depends on whether the transposed or nontransposed mode is used.

Columns in memory array 300 are selected in a nontransposed format when TE is low and a transposed format when TE is high.

When column select line generator 318 is in the ×8 mode, selecting either the transposed mode or nontransposed mode allows eight bit data words to be written into and read out of memory array 300 in either a transposed or nontransposed format. In the nontransposed mode (TE=0), selecting the ×1, ×2, or ×4 modes determines the size (width) of the data words written into and read out of memory array 300.

A mathematical description of the arrangement of FIG. 10 is given by Equation 11.

$$S[k]=!TE*(M1*C[k]+M2*C[k/2]+M4*C[k/4]+M8*C[k/8])+TE*C[k \bmod 8] \quad (11)$$

S[k] are the column select line signals on column select lines 332 and C are the decoded column address signals. TE, M1, M2, M4, and M8 are control signals. The symbols !, *, and +represent, the logical NOT, AND, and OR functions, respectively. The symbol "/" represents integer division and the abbreviation "mod" represents the modulo function.

Figure 11:
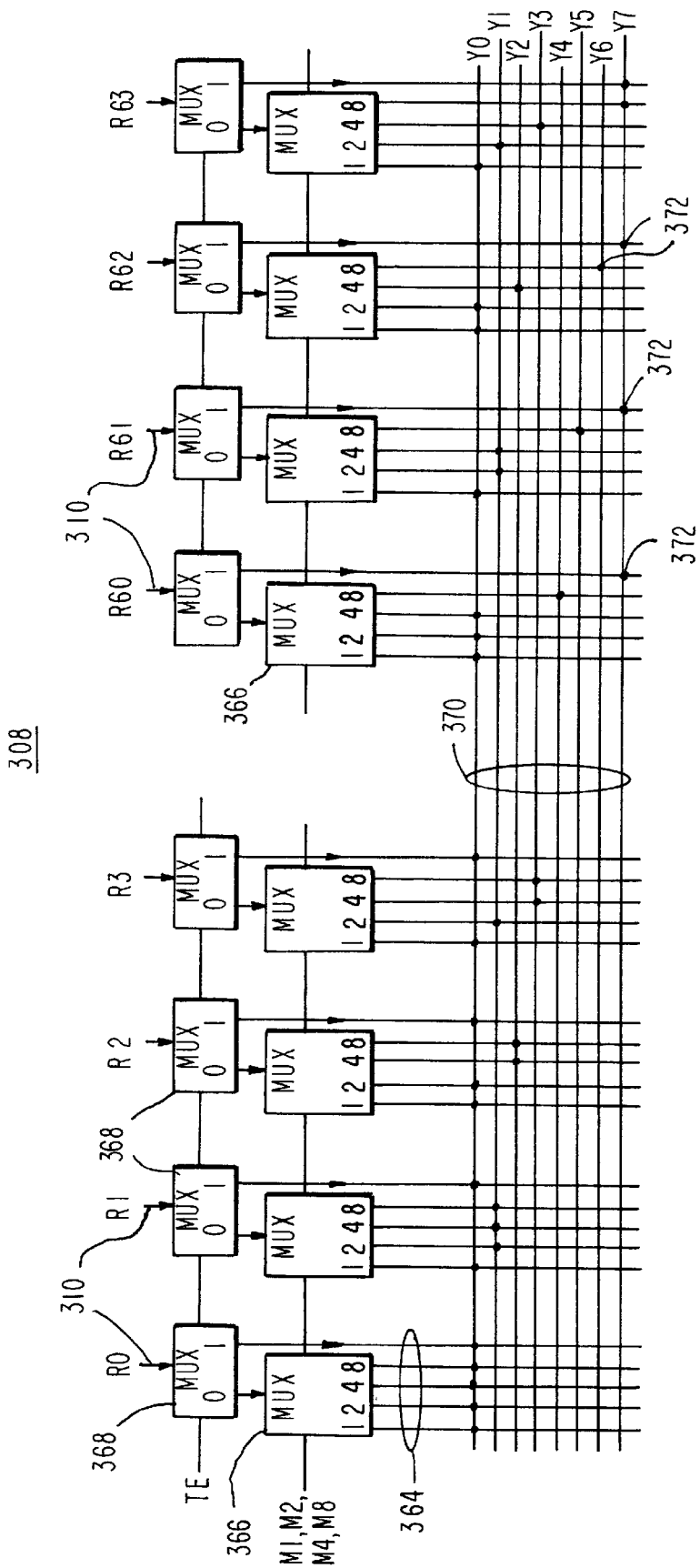
FIG. 11 is a diagram of the buffered read bit line selector of FIG. 2.

The circuitry in buffered read bit line selector 308 is shown in FIG. 11. Buffered read bit line signals R0–R63 are supplied on buffered read bit lines 310. A group of five vertical lines 364 is associated with each column of memory array 300. Four lines from each group of vertical lines 364 receive the outputs of a 4:1 demultiplexer 366 in each column. The input of each 4:1 demultiplexer 366 is fed by the "0" output of a 1:2 demultiplexer 368. A fifth line in each group of vertical lines 364 is connected to the "1" output of the 1:2 demultiplexer 368. Vertical lines 364 are connected to data output lines 370 by a pattern of fixed connections 372.

Demultiplexers 366 are controlled by mode selection signals M1, M2, M4, and M8, which control the paths for routing signals in the ×1, ×2, ×4 and ×8 modes. In the ×1 mode, the vertical lines 364 at the "1" outputs of demultiplexers 366 are connected to the "0" outputs of demultiplexers 368. In the ×2 mode, the vertical lines 364 at the "2" outputs of demultiplexers 366 are connected to the "0" outputs of demultiplexers 368. In the ×4 mode, the vertical lines 364 at the "4" outputs of demultiplexers 366 are connected to the "0" outputs of demultiplexers 368. In the ×8 mode, the vertical lines 364 at the "8" outputs of demultiplexers 366 are connected to the "0" outputs of demultiplexers 368.

The transpose enable signal TE controls whether data is read out of memory array 300 in the transposed mode or in the nontransposed mode. When TE is 0, the buffered read bit line signals R are passed to the "0" outputs of demultiplexers 368. When TE is 1, the buffered read bit line signals R are passed to the "1" outputs of demultiplexers 368.

When buffered read bit line selector 308 is in the ×8 mode, selecting either the transposed mode or nontransposed mode allows eight bit data words to be read out of memory array 300 in either a transposed or nontransposed format. In the nontransposed mode (TE=0), selecting the ×1, ×2, or ×4 modes determines the size (width) of the data words read from memory array 300.

A mathematical description of the arrangement of FIG. 11 is given by Equation 12.

$$Y[k] = !TE * \left( M1 * \sum_{i=0}^{63} R[i+k] + \right.$$

-continued
$$\left. M2 * \sum_{i=0}^{31} R[2i+k] + M4 * \sum_{i=0}^{15} R[4i+k] + M8 * \sum_{i=0}^{7} R[8i+k] \right) + TE * \sum_{i=0}^{7} R[8k+i] \quad (12)$$

Y[k] are the data output signals on data output lines 370. R are the buffered read bit line signals. TE, M1, M2, M4, and M8 are control signals. The symbols ! and * represent the logical NOT and AND functions, respectively. The symbol "Σ" represents repeated logical OR operations. The symbol "+" inside of the brackets represents addition. Outside of the brackets, the symbol "+" represents the logical OR function.

In the ×8 mode, the user can toggle between the transposed data word format and the nontransposed format using the transposed enable signal TE. The data word size in both formats is eight bits. When the nontransposed data word format is being used, the user can select from among the ×8, ×4, ×2, and ×1 modes. The data word size varies depending on the selected mode (i.e., eight bits for the ×8 mode, four bits for the ×4 mode, two bits for the ×2 mode and one bit for the ×1 mode).

If desired, memory region 298 can be suitably modified to accommodate operation in the ×1, ×2, and ×4 modes using transposed words. If operated in the ×4 mode, for example, nontransposed words would be four bits long and transposed words would be 16 bits long. Circuitry may be provided to allow the user to access a selected subset of such sixteen bit transposed data words. A buffer may be provided to allow eight bits of such a sixteen bit word to be shifted in or out of memory array 300 at a time, over the course of two cycles. Data may be held for two cycles before being released. The user may address both eight bit components of the sixteen bit data word using the same address.

The foregoing is merely illustrative of the principles of this invention and various modifications can be made by those skilled in the art without departing from the scope and spirit of the invention. For example, the number of rows and columns of memory array cells that are used is not critical. In addition, the ×2, ×4, and ×8 modes used in the variable depth and width memory array are illustrative. Modes supporting different word sizes may be used, if desired.

What is claimed is:

1. A programmable logic device memory circuit, comprising:

a memory array having a plurality of rows and columns of memory cells for storing data; and multiplexer circuitry for accessing data in the memory array, the multiplexer circuitry being responsive to a transpose enable signal for selecting between a nontransposed mode in which the memory array is accessed using nontransposed words and a transposed mode in which the memory array is accessed using transposed words.

2. The programmable logic device memory circuit defined in claim 1 further comprising variable depth and width circuitry for accessing data in the memory array, the variable depth and width circuitry being responsive to mode selection signals that determine the size of the words used to access the memory array.

3. The programmable logic device memory circuit defined in claim 1 further comprising a write bit line generator responsive to the transpose enable signal for writing nontransposed words into the memory array and for writing transposed words into the memory array.

4. The programmable logic device memory circuit defined in claim 3 wherein the write bit line generator is responsive to mode selection signals that determine the size of the words written into the memory array.

5. The programmable logic device memory circuit defined in claim 1 further comprising a read bit line selector responsive to the transpose enable signal for reading nontransposed words from the memory array and for reading transposed words from the memory array.

6. The programmable logic device memory circuit defined in claim 5 wherein the read bit line selector is responsive to mode selection signals that determine the size of the words read from the memory array.

7. The programmable logic device memory circuit defined in claim 1 further comprising a column select line generator responsive to the transpose enable signal for addressing the columns of the memory array in a nontransposed mode and a transposed mode.

8. The programmable logic device memory circuit defined in claim 7 wherein the column select line generator is responsive to mode selection signals that determine the size of the words addressed in the memory array.

9. The programmable logic device memory circuit defined in claim 1 further comprising a word line for selecting a given row of memory cells from among the plurality of rows of memory cells in the memory array.

10. The programmable logic device memory circuit defined in claim 9 wherein the memory cells in the given row correspond to a two dimensional matrix having virtual rows and virtual columns, the multiplexer circuitry supporting reading and writing of the virtual rows when the transpose enable signal is in a first logic state and reading and writing of the virtual columns when the transpose enable signal is in a second logic state.

11. The programmable logic device memory circuit defined in claim 1 further comprising at least one region of programmable logic, wherein the memory cells store data from the region of programmable logic.

12. A method for using a programmable logic device memory circuit having a memory array with a plurality of rows and columns of memory cells for storing data and multiplexer circuitry responsive to a transpose enable signal for accessing data in the memory array, comprising the steps of:

accessing the memory array using nontransposed words when the multiplexer circuitry is in a nontransposed mode; and accessing the memory array using transposed words when the multiplexer circuitry is in a transposed mode.

13. The method defined in claim 12 wherein the programmable logic device memory circuit further comprises variable depth and width circuitry responsive to mode selection signals, comprising the steps of:

accessing data in the memory array using the variable depth and width circuitry; and adjusting the size of the words used to access the memory array by providing the mode selection signals to the variable depth and width circuitry.

14. The method defined in claim 12 wherein the programmable logic device memory circuit further comprises a write bit line generator responsive to the transpose enable signal, the method further comprising the steps of:

writing nontransposed words into the memory array with the write bit line generator; and writing transposed words into the memory array with the write bit line generator.

15. The method defined in claim 14 wherein the write bit line generator is responsive to mode selection signals, the method further comprising the step of adjusting the size of the words written into the memory array with the write bit line generator using the mode selection signals.

16. The method defined in claim 12 wherein the programmable logic device memory circuit further comprises a read bit line selector responsive to the transpose enable signal, the method further comprising the steps of:

reading nontransposed words from the memory array with the read bit line selector; and reading transposed words from the memory array with the read bit line selector.

17. The method defined in claim 16 wherein the read bit line selector is responsive to mode selection signals, the method further comprising the step of adjusting the size of the words read from the memory array with the read bit line selector using the mode selection signals.

18. The method defined in claim 12 wherein the programmable logic device memory circuit further comprises a column select line generator responsive to the transpose enable signal, the method further comprising the steps of:

addressing the columns of the memory array with the column select line generator in a nontransposed mode; and addressing the columns of the memory array with the column select line generator in a transposed mode.

19. The method defined in claim 18 wherein the column select line generator is responsive to mode selection signals, the method further comprising the step of adjusting the size of the words addressed by the column select line generator using the mode selection signals.

20. The method defined in claim 12 wherein the programmable logic device memory circuit further comprises a word line, the method further comprising the step of selecting a given row of memory cells from among the plurality of rows of memory cells in the memory array using the word line.

21. The method defined in claim 20 wherein the memory cells in the given row of memory cells correspond to a two dimensional matrix having virtual rows and virtual columns, the method further comprising the steps of:

reading and writing virtual rows with the multiplexer circuitry when the transpose enable signal is in a first logic state; and reading and writing virtual columns with the multiplexer circuitry when the transpose enable signal is in a second logic state.

22. The method defined in claim 12 wherein the programmable logic device memory circuit further comprises at least one region of programmable logic, the method further comprising the steps of:

providing data with the region of programmable logic; and storing the data from the region of programmable logic in the memory array.

* * * * *